(12) United States Patent
Morishita et al.

(10) Patent No.: US 7,763,960 B2
(45) Date of Patent: Jul. 27, 2010

(54) SEMICONDUCTOR DEVICE, METHOD FOR MANUFACTURING SEMICONDUCTOR DEVICE, AND ELECTRIC EQUIPMENT SYSTEM

(75) Inventors: Tatsuya Morishita, Osaka (JP); Osamu Ishikawa, Kyoto (JP)

(73) Assignee: Panasonic Corporation, Osaka (JP)

( * ) Notice: Subject to any disclaimer, the term of this patent is extended or adjusted under 35 U.S.C. 154(b) by 426 days.

(21) Appl. No.: 11/852,672

(22) Filed: Sep. 10, 2007

(65) Prior Publication Data

US 2008/0061415 A1    Mar. 13, 2008

(30) Foreign Application Priority Data

Sep. 11, 2006  (JP)  ............................. 2006-245676

(51) Int. Cl.
*H01L 23/495*  (2006.01)
(52) U.S. Cl. .............................. 257/676; 257/E21.705; 257/E23.006; 438/107
(58) Field of Classification Search ................ 257/676, 257/E21.705, E23.006
See application file for complete search history.

(56) References Cited

U.S. PATENT DOCUMENTS

| 5,910,682 | A | 6/1999 | Song |
| 6,225,702 | B1 | 5/2001 | Nakamura |
| 6,288,445 | B1 | 9/2001 | Kimura |
| 2005/0041403 | A1* | 2/2005 | Cady et al. .................. 361/749 |
| 2006/0091530 | A1* | 5/2006 | Wang .......................... 257/712 |

FOREIGN PATENT DOCUMENTS

| JP | 10-65096 | 3/1998 |
| JP | 11-74407 | 3/1999 |
| JP | 2000-58594 | 2/2000 |

* cited by examiner

*Primary Examiner*—Trung Dang
(74) *Attorney, Agent, or Firm*—Hamre, Schumann, Mueller & Larson, P.C.

(57) ABSTRACT

A semiconductor device of the present invention includes: a plurality of semiconductor chips each having a chip size package structure; and a substrate bonded via an adhesive material to an opposite surface in each of the plurality of semiconductor chips that is opposite to a connection surface that is provided with solder balls (external connection terminals). Thereby, the plurality of semiconductor chips are connected to each other.

8 Claims, 7 Drawing Sheets

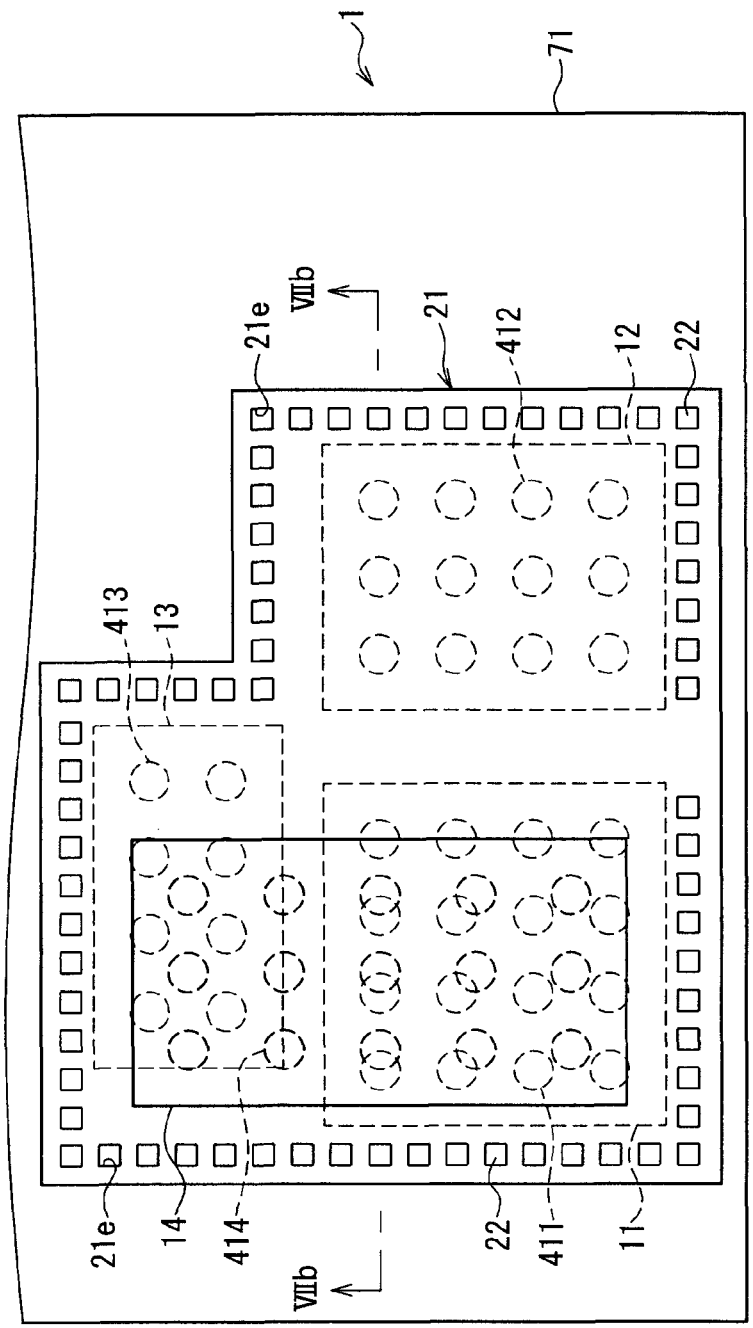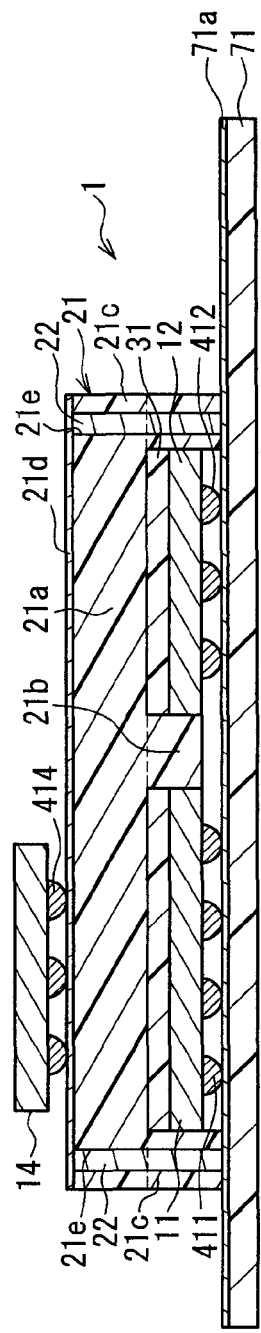
FIG. 7A
FIG. 7B

SEMICONDUCTOR DEVICE, METHOD FOR MANUFACTURING SEMICONDUCTOR DEVICE, AND ELECTRIC EQUIPMENT SYSTEM

BACKGROUND OF THE INVENTION

1. Field of the Invention

The present invention relates to a semiconductor device, in particular, a semiconductor device including semiconductor chips each having a chip size package (CSP) structure, a method for manufacturing the same, and an electric equipment system using the same.

2. Description of Related Art

In recent years, for example, along with an increasing demand for smaller electronic equipment, semiconductor devices strongly are required to be smaller and have higher density (higher integration). In order to satisfy this demand, in conventional semiconductor devices, as described in, for example, JP H11-74407A, the use of semiconductor chips each configured in a CSP structure is proposed.

Referring now to FIG. 9, a conventional semiconductor device will be described in detail.

FIG. 9A is a perspective view of a conventional semiconductor device. FIG. 9B is a plan view of the conventional semiconductor device of FIG. 9A as viewed in the direction of the arrow IXb. FIG. 9C is a side view of the conventional semiconductor device.

As shown in FIG. 9, a conventional semiconductor device includes a semiconductor chip 111 in which two functional circuit blocks 101 and 102 are formed. In this conventional semiconductor device, a plurality of solder balls 141 serving as external connection terminals for external connection are formed on one surface of the semiconductor chip 111 so that the solder balls 141 are electrically connected to a mounting board of a set product in which the semiconductor device is mounted. The semiconductor chip 111 is configured in a CSP structure, so the semiconductor chip 111 is packaged except the solder balls 141. This conventional semiconductor device, unlike ordinary semiconductor devices having pins (lead frame) as external connection terminals, has been considered capable of being miniaturized even when the number of external connection terminals is increased to achieve higher density.

However, in the above conventional semiconductor device, problems often arise when attempting to achieve multi-functionality in that the mounting area increases significantly and considerable time and effort are required for the mounting operation.

More specifically, in the conventional semiconductor device, when the number of various different functional circuit blocks integrated in a single semiconductor chip (i.e., the installed number) is increased, mutual interference is likely to occur between the functional circuit blocks. In other words, when attempting to achieve multi-functionality in the conventional semiconductor device, degradation of isolation characteristics, the resulting degradation of electrical characteristics and the like are likely to occur, and the installed number of semiconductor chips mounted in the set product needs to be increased. Consequently, it has been difficult to suppress the increase of mounting area in the conventional semiconductor device.

Further, when the semiconductor chip is mounted onto the mounting board of the set product, the semiconductor chip usually is disposed on the mounting board, being held by the arms of a mounting device or the like. For this reason, in the conventional semiconductor device, it is necessary to ensure, in the mounting board, in addition to the mounting area in which a plurality of semiconductor chips are mounted, a space for disposing the semiconductor chips on the mounting board for each of the plurality of semiconductor chips. Accordingly, when attempting to achieve multi-functionality in the conventional semiconductor device, not only does the actual mounting area increase significantly, but also considerable time and effort are required for the mounting operation.

SUMMARY OF THE INVENTION

Therefore, with the foregoing in mind, it is an object of the present invention to provide a semiconductor device that can be mounted easily while suppressing the increase of the mounting area even when attempting to achieve multi-functionality, a method for manufacturing the same, and an electric equipment system including the same.

In order to address the above object, a semiconductor device according to the present invention includes: a plurality of semiconductor chips each having a chip size package structure and a connection surface provided with an external connection terminal for external connection; and a substrate for connecting the plurality of semiconductor chips to each other so as to be bonded via an adhesive material to a surface other than the connection surface in each of the plurality of semiconductor chips.

In the semiconductor device configured as above, the plurality of semiconductor chips is connected to each other by the adhesive material and the substrate. Thereby, unlike the conventional technology, even when attempting to achieve multi-functionality, the increase of the mounting area can be suppressed. Moreover, because the plurality of semiconductor chips is combined into one piece, the semiconductor device can be mounted easily.

As used herein, "semiconductor chip" includes, not only a chip that forms a semiconductor integrated circuit (IC) having a plurality of functions (including multifunctional chips such as a system LSI), but also a single-function discrete component such as transistor or thyristor.

Further, in the above-described semiconductor device, it is preferable that the substrate is bonded via an adhesive material to an opposite surface in each of the plurality of semiconductor chips that is opposite to the connection surface, thereby connecting the plurality of semiconductor chips to each other.

In this case, a sufficient bonding area can be ensured easily between the substrate and each semiconductor chip, so the mechanical strength of the semiconductor device can be improved easily.

Further, in the above-described semiconductor device, it is preferable that the substrate is made of a metal material.

In this case, a semiconductor device having excellent mechanical strength can be obtained, and at the same time, the heat dissipation characteristics of the semiconductor device can be improved easily.

Further, in the above-described semiconductor device, the substrate may be formed to have a polygonal shape including an L shape and a T shape.

In this case, because the semiconductor chips are connected by the substrate having a shape corresponding to the shape of a mounting board for mounting the semiconductor chips, the increase of the mounting area of the semiconductor device can be minimized, and the ease of handling of the semiconductor device can be improved, easily achieving the simplification of mounting operation.

Further, in the above-described semiconductor device, it is preferable that the substrate is provided with a shield portion disposed between two of the semiconductor chips to prevent the two semiconductor chips from being brought into direct contact with each other.

In this case, because the two semiconductor chips are connected by the substrate into one piece while the two semiconductor chips are spaced apart from each other by the shield portion, the isolation characteristics of the semiconductor device can be improved.

Further, in the above-described semiconductor device, the shield portion may be formed by deforming a part of the substrate.

In this case, a semiconductor device having improved isolation characteristics can be obtained while the number of components in the semiconductor device is reduced.

Further, in the above-described semiconductor device, as the adhesive material, a conductive adhesive material and an insulating adhesive material may be used.

In this case, because the plurality of semiconductor chips can be connected to the substrate in an electrically connected state or in an electrically insulated state, the semiconductor chips can be connected to the substrate according to the electrical characteristics of each semiconductor chip. As a result, even when connecting a plurality of semiconductor chips, isolation characteristics can be improved easily, and at the same time, the electrical characteristics of each semiconductor chip can be prevented from being degraded.

Further, in the above-described semiconductor device, it is preferable that at least one of the substrate and the adhesive material is connected to a power source or a ground to have the same potential as the power source or the ground.

In this case, because a semiconductor chip has the same potential as the power source or the ground through at least one of the substrate and the adhesive material, in the semiconductor chip, it is possible to prevent the occurrence of spurious characteristic, noise and the like caused by the harmful influence from the other semiconductor chip. Accordingly, the semiconductor device having excellent isolation characteristics and excellent electrical characteristics can be obtained easily.

Further, in the above-described semiconductor device, it is preferable that the substrate connects the plurality of semiconductor chips to each other such that, with respect to a mounting board for mounting the plurality of semiconductor chips, the external connection terminal in each of the plurality of semiconductor chips is connected electrically to a wiring pattern provided on the mounting board.

In this case, there is no need to provide a different wiring pattern for each semiconductor device in the mounting board for mounting the semiconductor device.

Further, in the above-described semiconductor device, it is preferable that, in the substrate, a wiring pattern is formed on an opposite surface that is opposite to a connect surface on which the plurality of semiconductor chips are connected, and the opposite surface serves as a mounting surface.

In this case, the substrate can be used as a mounting board having a mounting surface, so it is possible easily to obtain a semiconductor device on which a large number of semiconductor chips can be mounted easily.

Further, in the above-described semiconductor device, a through hole may be formed in the substrate to connect electrically the wiring pattern formed on the opposite surface and the wiring pattern provided on the mounting board for mounting the plurality of semiconductor chips.

In this case, because the through hole allows easy connection between the wiring pattern on the substrate and the wiring pattern on the mounting board, the plurality of semiconductor chips can be mounted easily onto the mounting board.

A method for manufacturing a semiconductor device of the present invention includes the steps of: forming a plurality of semiconductor chips each having a chip size package structure; and connecting the plurality of semiconductor chips formed in the forming step by bonding a substrate to surfaces in the plurality of semiconductor chips other than connection surfaces on which an external connection terminal for external connection are formed by interposing an adhesive material between the substrate and the surfaces.

In the above method for manufacturing a semiconductor device, in the forming step, a plurality of semiconductor chips each having a chip size package structure are formed. Subsequently, the plurality of semiconductor chips are connected to each other by a substrate bonded to surfaces in the plurality of semiconductor chips other than connection surfaces by interposing an adhesive material between the substrate and the surfaces. Thereby, unlike the conventional example, even when attempting to achieve multi-functionality, the increase of the mounting area can be suppressed, and at the same time, a semiconductor device that can be mounted easily can be produced.

Further, the above method for manufacturing a semiconductor device further may include a step of mounting the plurality of semiconductor chips connected in the connecting step onto an external mounting board.

In this case, the plurality of semiconductor chips are mounted on an external mounting board in which the semiconductor device is incorporated, so that a set product in which the semiconductor device is incorporated can be obtained.

An electric equipment system of the present invention includes a transmission unit that transmits information and a reception unit that receives information, wherein at least one of the transmission unit and the reception unit is configured with any one of the above-described semiconductor devices.

In the electric equipment system configured as above, even when attempting to achieve multi-functionality, the increase of the mounting area can be suppressed, and at the same time, because the semiconductor device that can be mounted easily is used in at lease one of the transmission unit and the reception unit, it is possible to easily reduce the size and to obtain a high performance electric equipment system that can be manufactured easily.

BRIEF DESCRIPTION OF THE DRAWINGS

FIG. 7A is a perspective view of a semiconductor device according to Embodiment 5 of the present invention.

FIG. 7B is a cross sectional view taken along the line VIIb-VIIb of FIG. 7A.

DETAILED DESCRIPTION OF THE INVENTION

Hereinafter, preferred embodiments of a semiconductor device, a method for manufacturing the semiconductor device, and an electric equipment system according to the present invention will be described with reference to the accompanying drawings.

Embodiment 1

Figure 1A:
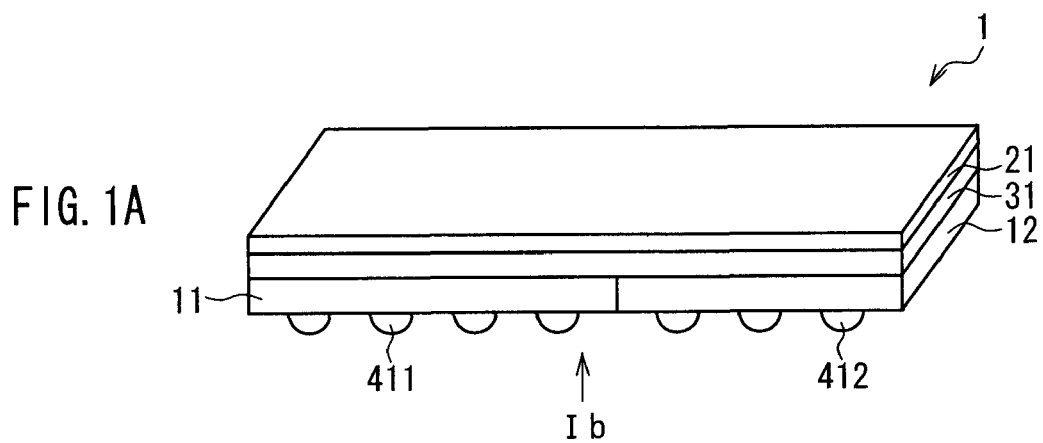
FIG. 1A is a perspective view of a semiconductor device according to Embodiment 1 of the present invention.
Figure 1B:
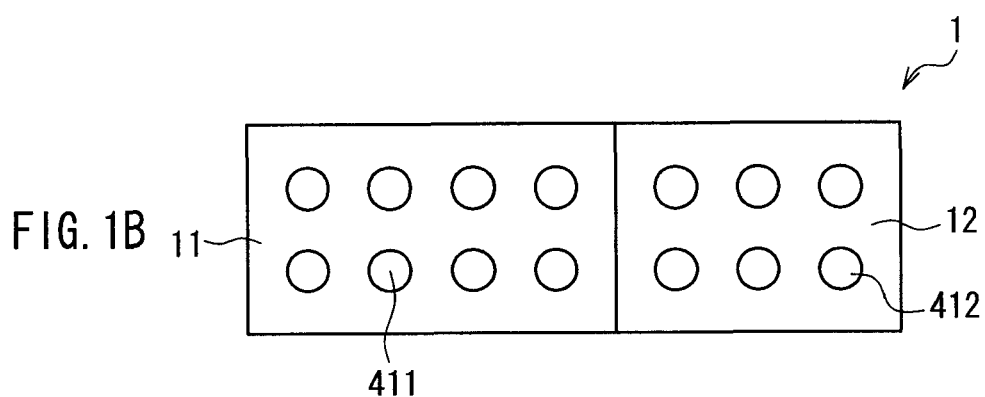
FIG. 1B is a plan view of the semiconductor device of FIG. 1A as viewed in the direction of the arrow Ib.

FIG. 1A is a perspective view of a semiconductor device according to Embodiment 1 of the present invention. FIG. 1B is a plan view of the semiconductor device of FIG. 1A as viewed in the direction of the arrow Ib. As shown in the drawings, a semiconductor device 1 according to this embodiment includes a plurality of, for example, two semiconductor chips 11 and 12 each having in a chip size package (CSP) structure. On the semiconductor chips 11 and 12, solder balls 411 and 412 serving as external connection terminals for external connection are formed, respectively, and the solder balls 411 and 412 can be connected electrically to a mounting board (not shown) of a set product in which the semiconductor device 1 is mounted. In each of the semiconductor chips 11 and 12, at least one functional circuit block (not shown) is provided that performs a predetermined operation upon application of predetermined electrical characteristics to each of the semiconductor chips 11 and 12.

As shown in FIG. 1A, the semiconductor chips 11 and 12 are fixed to each other by the substrate 21 with the connection surfaces on which the solder balls 411 and 412 are formed facing the bottom of FIG. 1A. Specifically, in the semiconductor device 1, on the opposite surfaces that are opposite to the connection surfaces in the semiconductor chips 11 and 12, an adhesive material 31 and the substrate 21 are sequentially laminated, and the substrate 21 connects the semiconductor chips 11 and 12 to each other via the adhesive material 31. The semiconductor chips 11 and 12 have a cubic-like shape having a dimension of about 0.9 to 5.2 mm in length, about 0.9 to 3.2 mm in width and about 0.3 to 0.8 mm in height. As the adhesive material 31, for example, an epoxy resin-based adhesive is used. Both surfaces, that is, the upper surface and the bottom surface of the adhesive material 31 are bonded respectively to the substrate 21 and the semiconductor chips 11 and 12.

As the substrate 21, a flat plate is used, and the shape is determined based on the size of the bonding surfaces (opposite surfaces) of the semiconductor chips 11 and 12 that are connected to each other, and the like. The substrate 21 is made of a metal material such as gold or copper.

In addition to the foregoing, it is also possible to form the substrate 21 with a synthetic resin material, preferably, a glass epoxy resin, polyimide resin or the like having excellent heat resistance. However, it is preferable that the substrate 21 is formed with the metal material as described above because the substrate has excellent mechanical strength and excellent heat dissipation characteristics, the semiconductor device 1 having excellent mechanical strength can be formed easily, and the heat dissipation characteristics of the semiconductor device 1 can be improved easily. Furthermore, with the substrate 21 having excellent mechanical strength (rigidity), even when the number of semiconductor chips is increased in the semiconductor device, the semiconductor chips can be formed easily into one piece while preventing bending.

In the semiconductor device 1, the substrate 21 connects the plurality of semiconductor chips 11 and 12 to each other such that, with respect to a mounting board for mounting the plurality of semiconductor chips 11 and 12, the solder balls (external connection terminals) 411 and 412 of the plurality of semiconductor chips 11 and 12 are connected electrically to a wiring pattern (not shown) provided on the mounting board.

More specifically, packaging is performed for the semiconductor chips 11 and 12, except for the solder balls 411 and 412 having a hemispherical shape protruding from the connection surfaces, in which the semiconductor chips 11 and 12 are covered with an insulating film having electrical insulation. In the semiconductor chip 11, as shown in FIG. 1B, two solder balls 411 are arranged along the vertical direction and four solder balls 411 are arranged along the horizontal direction of FIG. 1B. These eight solder balls 411 in total are provided such that each two adjacent solder balls 411 in the vertical and horizontal directions are spaced apart from each other at an equal spacing (e.g., 0.3 to 0.4 mm).

Similarly, in the semiconductor chip 12, as shown in FIG. 1B, two solder balls 412 are arranged along the vertical direction and three solder balls 412 are arranged along the horizontal direction. These six solder balls 412 in total are provided such that each two adjacent solder balls 411 in the vertical and horizontal directions are spaced apart from each other at an equal spacing (e.g., 0.3 to 0.4 mm). And, in the semiconductor device 1, when mounting the semiconductor chips 11 and 12 connected by the substrate 21 onto the mounting board, for example, the solder balls 411 and 412 arranged on the upper side of FIG. 1B are electrically connected to one wiring pattern, and the solder balls 411 and 412 on the lower side of FIG. 1B are electrically connected to a wiring pattern different from the wiring pattern to which the solder balls 411 and 412 on the upper side are connected.

Because the substrate 21 connects the plurality of semiconductor chips 11 and 12 to each other such that the plurality of solder balls 411 and 412 are electrically connected to the corresponding wiring patterns on the mounting board, there is no need to provide a different wiring pattern for each semiconductor device 1. Accordingly, the semiconductor device 1 can be obtained that can be mounted easily onto a standard and versatile mounting board in which the same wiring pattern is formed (this applies to the embodiments which will be described later).

Figure 2:
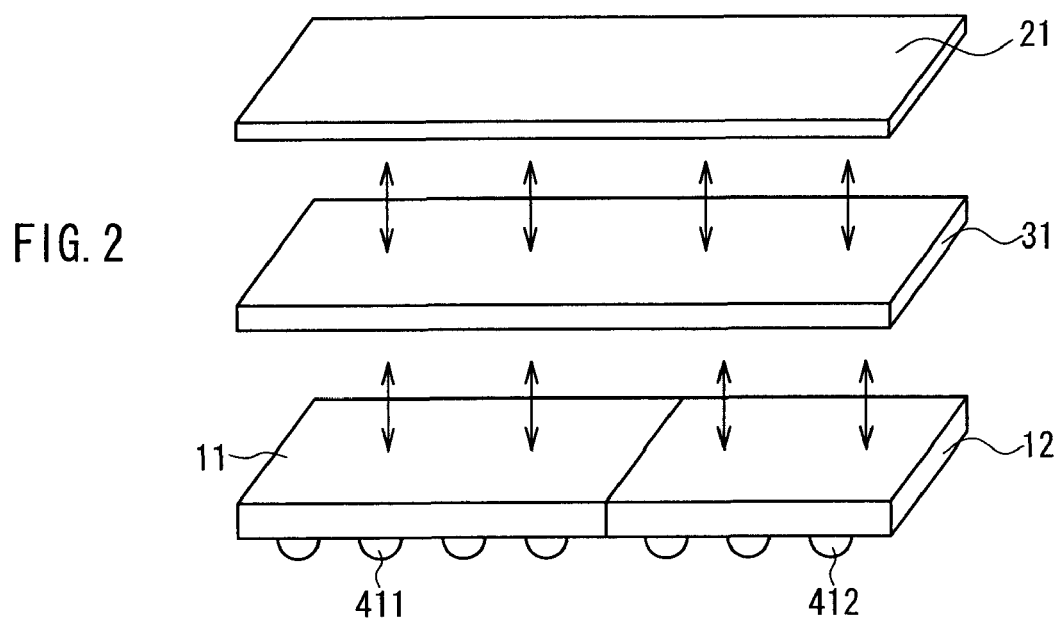
FIG. 2 is a diagram schematically illustrating the semiconductor device of FIG. 1A.
Figure 3:
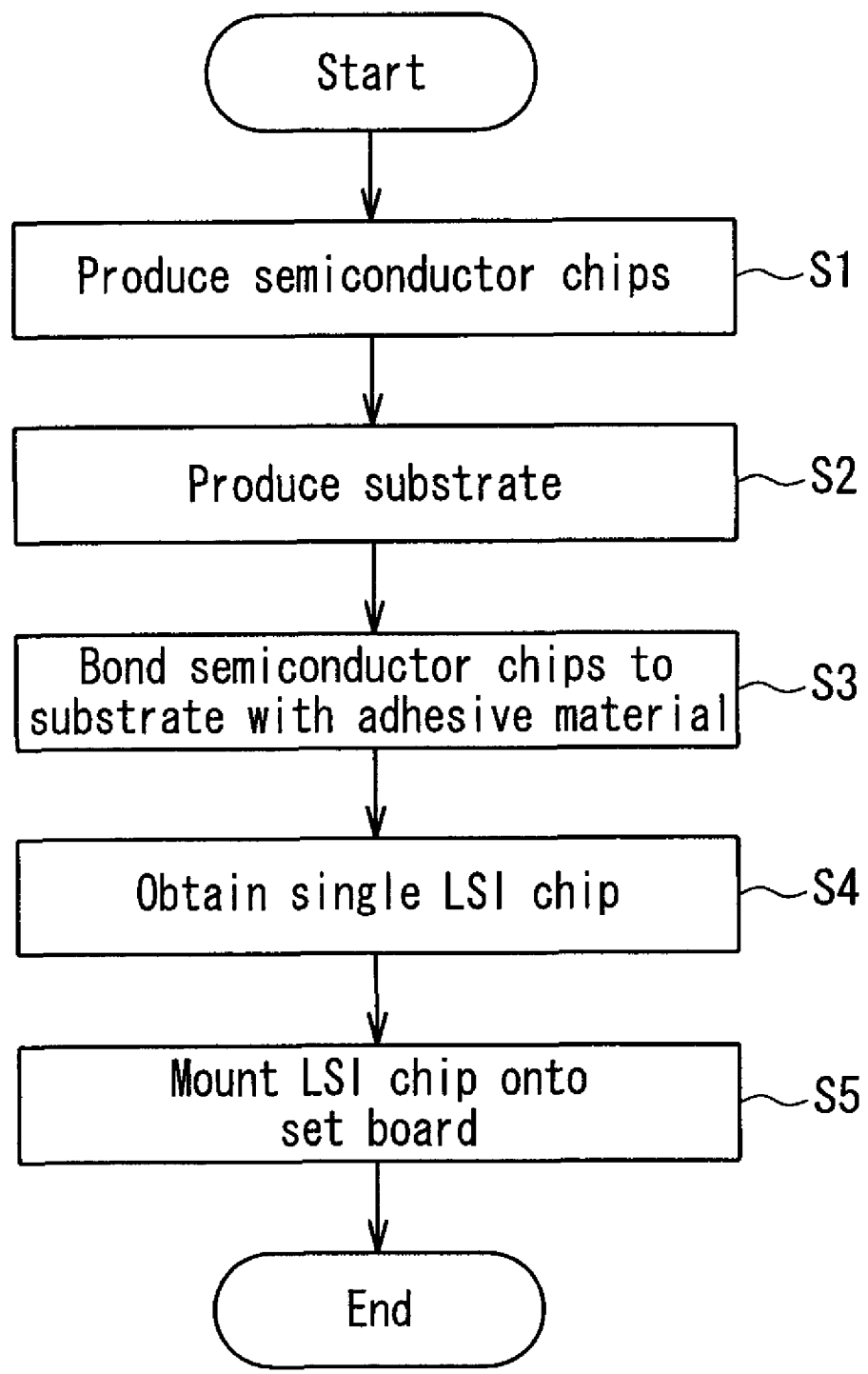
FIG. 3 is a flowchart showing a manufacturing process of the semiconductor device of FIG. 1A.

Referring now to FIGS. 2 and 3, a method for manufacturing the semiconductor device 1 of this embodiment will be described in detail.

In the semiconductor device 1 of this embodiment, a forming step of forming a plurality of semiconductor chips each having the chip size package structure is performed first. Specifically, as shown in step S1 in FIG. 3, for a semiconductor device 1 of this embodiment, the production of the plurality of semiconductor chips 11 and 12, which will be combined into one piece as the semiconductor device 1, is performed.

Subsequently, a connecting step is performed in which the plurality of semiconductor chips formed in the forming step are connected to each other by bonding a substrate to the surfaces in the plurality of semiconductor chips other than the connection surfaces on which external connection terminals for external connection are formed with an adhesive material interposed therebetween. Specifically, as shown in step S2 in FIG. 3, after the production of the substrate 21, as shown in step S3 in FIG. 3, the substrate 21 is bonded to the semiconductor chips 11 and 12 by the adhesive material 31. More specifically, as shown in FIG. 2, the semiconductor chips 11 and 12 are arranged such that their side faces come into tight contact with each other and their surfaces to be in contact with the substrate facing upward in FIG. 2, after which the surfaces to be in contact with the substrate are bonded to the underside of the adhesive material 31. Onto the upper surface of the adhesive material 31, the underside of the substrate 21 is bonded. Thereby, the substrate 21 is combined with the semiconductor chips 11 and 12 with the adhesive material 31 interposed therebetween to form one piece. As a result, as shown in step S4 in FIG. 3, in the semiconductor device 1, the semiconductor chips 11 and 12 are produced, taking as a single LSI chip of one CSP structure.

Subsequently, a mounting step is performed in which the plurality of semiconductor chips connected in the connecting step are mounted onto an external mounting board. Specifically, as shown in step S5 in FIG. 3, the semiconductor chips 11 and 12 are connected electrically to wiring patterns of the mounting board, and the semiconductor device 1 is mounted onto the mounting board of the set product.

In the semiconductor device 1 of this embodiment configured as above, the semiconductor chips 11 and 12 are connected to each other by the adhesive material 31 and the substrate 21. Thereby, in the semiconductor device 1 of this embodiment, unlike the conventional technology, even when attempting to achieve multi-functionality, the increase of the mounting area can be suppressed, and at the same time, the semiconductor device 1 can be mounted easily. In other words, in the semiconductor device 1 of this embodiment, the semiconductor chips 11 and 12, each having at least one functional circuit block, are produced, taking as the single LSI chip of one CSP structure. Accordingly, even when attempting to achieve multi-functionality, unlike the conventional example, the increase of the number of semiconductor chips mounted on the mounting board of the set product can be suppressed, so the increase of the mounting area also can be suppressed. Also, in the semiconductor device 1 of this embodiment, the time and effort required for mounting the semiconductor device 1 onto the mounting board can be reduced.

Further, in the semiconductor device 1 of this embodiment, because the side faces of the semiconductor chips 11 and 12 are in tight contact with each other, even when the semiconductor chips 11 and 12 are disposed on a mounting board while being held by the arms of a mounting device or the like, unlike the conventional example, there is no need to provide a space for disposing semiconductor chips on the mounting board for each semiconductor chips. As a result, in the semiconductor device 1 of this embodiment, the substantial mounting area of the mounting board can be reduced.

Further, because the semiconductor device 1 of this embodiment includes a plurality of semiconductor chips 11 and 12, for example, when it is necessary to provide two functional circuit blocks that interfere with each other, by forming the two functional circuit blocks that interfere with each other within the semiconductor chips 11 and 12, mutual interference between the two functional circuit blocks can be prevented, and the semiconductor device 1 having excellent isolation characteristics in which the degradation of electrical characteristics is suppressed can be obtained.

The result of an isolation characteristics test conducted by the present inventors has proved that spurious characteristic can be improved by about 10 dB.

Embodiment 2

Figure 4A:
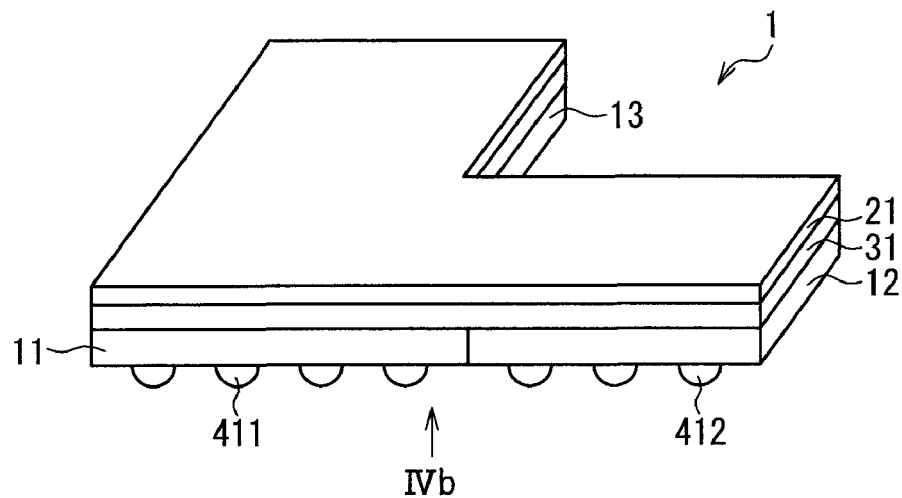
FIG. 4A is a perspective view of a semiconductor device according to Embodiment 2 of the present invention.
Figure 4B:
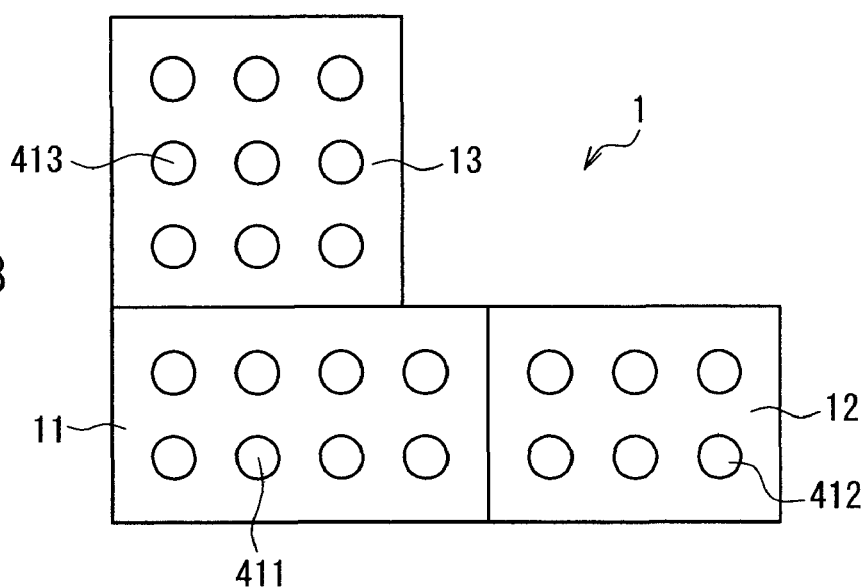
FIG. 4B is a plan view of the semiconductor device of FIG. 4A as viewed in the direction of the arrow IVb.

FIG. 4A is a perspective view of a semiconductor device according to Embodiment 2 of the present invention. FIG. 4B is a plan view of the semiconductor device of FIG. 4A as viewed in the direction of the arrow IVb. As can be seen from the diagrams, the main difference between this embodiment and Embodiment 1 given above is that a substrate configured to have an L shape is used. Note that the same reference numerals are given to the same components as those of Embodiment 1, so overlapping description is omitted.

Specifically, as shown in FIG. 4, a semiconductor device 1 according to this embodiment includes a semiconductor chip 13 having the CSP structure in addition to semiconductor chips 11 and 12 described above. In this semiconductor chip 13, as shown in FIG. 4B, solder balls 413 are formed, three of which are arranged in the vertical direction of FIG. 4B and three of which are arranged in the horizontal direction of FIG. 4B. The semiconductor chip 13 whose side face (the lower side face in FIG. 4B) is in tight contact with the side face (the upper side face in FIG. 4B) of the semiconductor chip 11 is connected to the semiconductor chips 11 and 12 by the substrate 21 configured to have an L shape via the adhesive material 31, thereby forming one piece.

With the above-described configuration, the semiconductor device 1 of this embodiment can produce operational effects similar to those of Embodiment 1. In the semiconductor device 1 of this embodiment, because the entire connection surface of the semiconductor device 1 is formed to have an L shape using the substrate 21 having an L shape corresponding to the arrangement of the semiconductor chips 11 to 13, when compared to a conventional example configured to have a square or rectangular shape, the semiconductor device 1 of this embodiment can be formed easily in mounting boards of various shapes.

In addition to the foregoing, it is also possible to form the semiconductor device in which a plurality of semiconductor chips are connected to each other using a substrate configured to have a polygonal shape such as a T shape. In other words, using a substrate having the polygonal shape such as an L shape or T shape, the entire connection surface of the semiconductor device 1 can be formed to have the same polygonal shape. By forming the semiconductor device 1 of this embodiment to have the polygonal shape, the semiconductor device 1 of this embodiment can be mounted in an area where a conventional example cannot be mounted such as an end portion of a mounting board or a small space surrounded by other electric components. Accordingly, the semiconductor device 1 of this embodiment can cope flexibly with the shape of the mounting board or the peripheral components mounted on the mounting board.

Embodiment 3

Figure 5A:
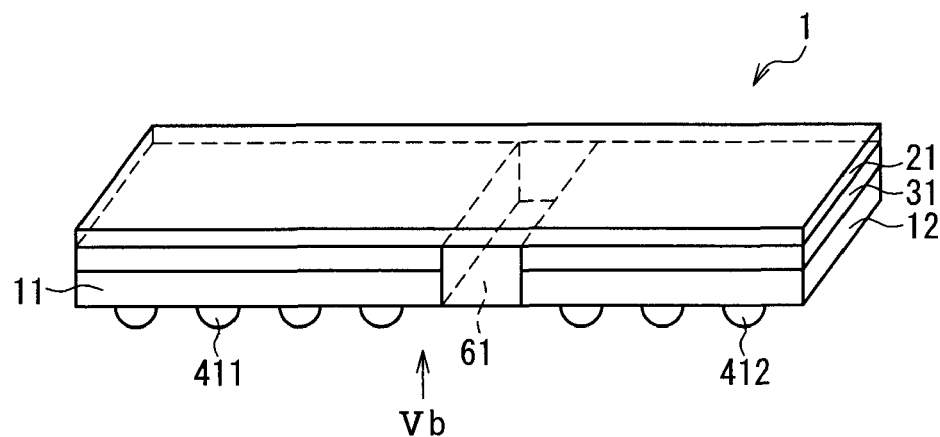
FIG. 5A is a perspective view of a semiconductor device according to Embodiment 3 of the present invention.
Figure 5B:
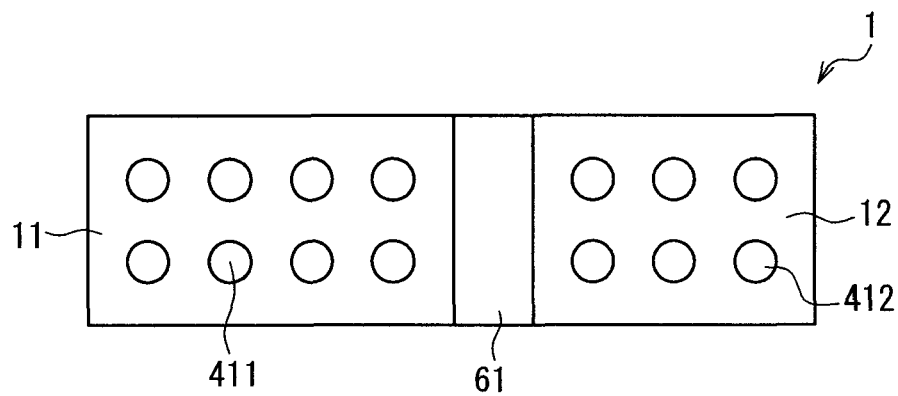
FIG. 5B is a plan view of the semiconductor device of FIG. 5A as viewed in the direction of the arrow Vb.

FIG. 5A is a perspective view of a semiconductor device according to Embodiment 3 of the present invention. FIG. 5B is a plan view of the semiconductor device of FIG. 5A as viewed in the direction of the arrow Vb. As can be seen from the diagrams, the main difference between this embodiment and Embodiment 1 given above is that the substrate is provided with a shield portion disposed between two semiconductor chips to prevent the two semiconductor chips from being brought into direct contact with each other. Note that the same reference numerals are given to the same components as those of Embodiment 1, so overlapping description is omitted.

Specifically, as shown in FIG. 5, in a semiconductor device 1 according to this embodiment, a shield portion 61 having a parallelepiped shape is disposed between semiconductor chips 11 and 12, and the shield portion 61 is bonded together with the semiconductor chips 11 and 12 to the substrate 21 via the adhesive material 31 while preventing the semiconductor chips 11 and 12 from being brought into direct contact with each other.

For the shield portion 61, a conductive material such as a metal material or an insulating material providing electrical insulation such as a synthetic resin material is selected appropriately according to the configuration of the semiconductor chips 11 and 12 (the type of functional circuit block(s) provided within each chip, the installed number and the like), the isolation characteristics required by the semiconductor device 1 and the like. The size of the shield portion 61 is determined considering the number and position (including the shapes of wiring patterns of the mounting board, etc.) of solder balls 411 and 412 formed on the semiconductor chips 11 and 12, and the like.

With the above-described configuration, the semiconductor device 1 of this embodiment can produce operational effects similar to those of Embodiment 1. In the semiconductor device 1 of this embodiment, because the shield portion 61 prevents the semiconductor chips 11 and 12 from being brought into direct contact with each other, these semiconductor chips 11 and 12 are connected by the substrate into one piece while the semiconductor chips 11 and 12 are spaced apart from each other by the shield portion 61, so the isolation characteristics of the semiconductor device 1 can be improved.

The above description discusses a configuration in which the shield portion is applied in a semiconductor device 1 including two semiconductor chips 11 and 12, but any other configuration can be used, as long as the shield portion of this embodiment is disposed between two adjacent semiconductor chips and can prevent the two semiconductor chips from being brought into direct contact with each other, and it is also possible to provide two or more shield portions in a semiconductor device including three or more semiconductor chips to improve the isolation characteristics of the semiconductor device.

In addition to the foregoing, when the shield portion 61 is formed using the conductive material, for example, by connecting the shield portion 61 directly to the ground, further excellent isolation characteristics can be realized.

The above description discusses the configuration in which the shield portion 61 is formed as a separate piece from the substrate 21, but the shield portion of this embodiment is not limited thereto, and it is also possible to use a shield portion formed by deforming a part of the substrate. The use of the substrate including such a shield portion is preferable because the semiconductor device having improved isolation characteristics while reducing the number of components of the semiconductor device can be obtained easily.

Embodiment 4

Figure 6:
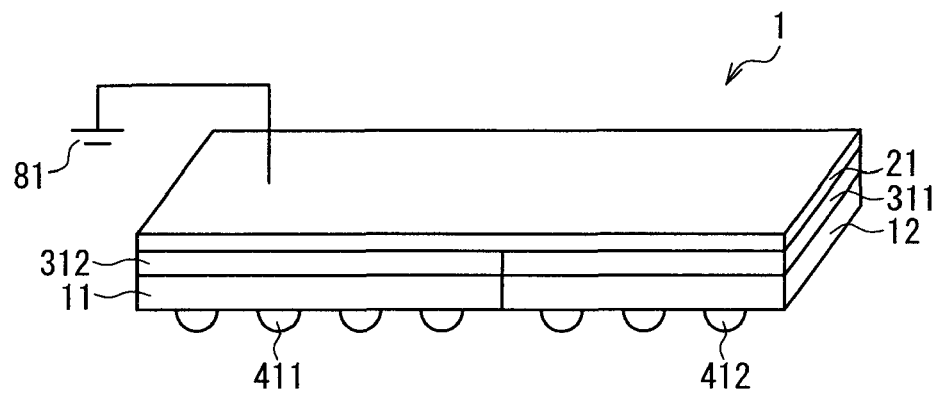
FIG. 6 is a perspective view of a semiconductor device according to Embodiment 4 of the present invention

FIG. 6 is a perspective view of a semiconductor device according to Embodiment 4 of the present invention. In FIG. 6, the main difference between this embodiment and Embodiment 1 given above is that a conductive adhesive material and an insulating adhesive material are used as adhesive materials, and the substrate is connected to the ground to have the same potential as the ground. Note that the same reference numerals are given to the same components as those of Embodiment 1, so overlapping description is omitted.

Specifically, as shown in FIG. 6, in a semiconductor device 1 according to this embodiment, the substrate 21 and the semiconductor chip 11 are bonded to each other via a conductive adhesive material 312, and the substrate 21 and the semiconductor chip 12 are bonded to each other via an insulating adhesive material 311. The substrate 21 is made of a conductive material such as a metal material, and is connected to the ground 81 provided on the mounting board side to have the same potential as the ground 81. Thereby, the semiconductor chip 11 has the same potential as the ground, that is, is grounded, through the conductive adhesive material 312 and the substrate 21.

As the insulating adhesive material 311, for example, an electrically insulating adhesive material such as an epoxy resin-based adhesive or polyimide resin-based adhesive is used. As the conductive adhesive material 312, for example, an adhesive material to which conductivity is imparted by adding and mixing conductive particles such as silver particles or nickel particles to the adhesive material is used.

With the above-described configuration, the semiconductor device 1 of this embodiment can produce operational effects similar to those of Embodiment 1. In the semiconductor device 1 of this embodiment, because the semiconductor chips 12 and 11 are bonded to the substrate 21 by the insulating adhesive material 311 and the conductive adhesive material 312 serving as adhesive materials, respectively, the semiconductor chip 11 is connected electrically to the substrate, and the semiconductor chip 12 is insulated electrically from the substrate 21. Thereby, in the semiconductor device 1 of this embodiment, the semiconductor chips 11 and 12 can be connected to the substrate 21 according to the electrical characteristics of each chip.

Specifically, the semiconductor chip 12 is bonded to the substrate 21 using the insulating adhesive material 311 so as to avoid the influence of the semiconductor chip 11 such as spurious characteristic, noise and the like. On the other hand, the semiconductor chip 11 that generates spurious characteristic, noise and the like and influences the semiconductor chip 12 is bonded to the substrate 21 using the conductive adhesive material 312. Thereby, the semiconductor chip 11 that generates spurious characteristic, noise and the like is connected to the ground 81 through the conductive adhesive material 312 and the substrate 21, and thus the spurious characteristic, noise and the like can escape to the outside through the ground 81.

On the other hand, because the semiconductor chip 12 is connected to the substrate 21 via the insulating adhesive material 311, the spurious characteristic, noise and the like from the semiconductor chip 11 is prevented, so high isolation characteristics can be realized and the degradation of the electrical characteristics can be prevented. As described above, by using the insulating adhesive material 311 and the conductive adhesive material 312 appropriately, even when connecting the plurality of semiconductor chips 11 and 12, isolation characteristics can be improved easily, and at the same time, the degradation of the electrical characteristics of the semiconductor chips 11 and 12 can be prevented.

The above description discusses a configuration in which the semiconductor chip 11 is connected to the ground 81 through the conductive adhesive material 312 and the substrate 21 to have the same potential as the ground 81, but the present invention is not limited thereto. Any other configuration can be used, as long as at least one of the substrate and the adhesive material are connected to a power source or ground of an external mounting board or the like to have the same potential as the power source or the ground. In other words, any other configuration can be used as long as the semiconductor chip is allowed to have the same potential as the power source of ground through at least one of the substrate and the adhesive material. Thereby, in the semiconductor chip, the occurrence of spurious characteristic, noise and the like by the harmful influence from the other semiconductor chip can be prevented. As a result, a semiconductor device having excellent isolation characteristics and excellent electrical characteristics can be obtained easily.

Embodiment 5

FIG. 7A is a perspective view of a semiconductor device according to Embodiment 5 of the present invention. FIG. 7B is a cross sectional view taken along the line VIIb-VIIb of FIG. 7A. In FIGS. 7A and 7B, the main difference between this embodiment and Embodiment 1 given above is that, in a substrate, a wiring pattern is formed on the opposite surface that is opposite to a connect surface on which the plurality of semiconductor chips are connected, and the opposite surface serves as a mounting surface. Note that the same reference numerals are given to the same components as those of Embodiment 1, so overlapping description is omitted.

Specifically, as shown in FIGS. 7A and 7B, in a semiconductor device 1 according to this embodiment, three semiconductor chips 11 to 13 are bonded to the substrate 21 via the adhesive material 31, whereby the semiconductor chips 11 to 13 are connected to one another by the substrate 21. The substrate 21 is configured as shown in FIG. 7B, using a synthetic resin material, and the whole is formed into one piece by a known production method such as an injection molding method.

More specifically, as shown in FIG. 7B, the substrate 21 includes a flat plate 21a configured to be flat, a shield portion 21b protruding downward in FIG. 7B from the flat plate 21a so that the shield portion 21b is disposed between the semiconductor chips 11 and 12, and an extending portion 21c that surrounds the periphery of the flat plate 21a and extends downward in FIG. 7B from the periphery of the flat plate 21a. The shield portion 21b serves to improve the isolation characteristics between the semiconductor chips 11 and 12. Although not shown, shield portions are formed between the semiconductor chips 11 and 13 and between the semiconductor chips 12 and 13 to improve the isolation characteristics between the semiconductor chips 11 and 13 and between the semiconductor chips 12 and 13, respectively.

In the substrate 21, as shown in FIG. 7B, a wiring pattern 21d is formed on the upper surface of the flat plate 21a and that of the extending portion 21c in FIG. 7B. In other words, in this substrate 21, the wiring pattern 21d is formed using, for example, a conductive printing ink on the upper surface that is opposite to a connect surface on which the semiconductor chips 11 to 13 are connected, so that the upper (opposite) surface functions as a mounting surface. As a result, in the semiconductor device 1 of this embodiment, as shown in FIG. 7A, an external semiconductor chip 14 is mounted on the upper surface of the substrate 21, and the solder balls 414 of the external semiconductor chip 14 are electrically connected to the wiring pattern 21d. Note that the wiring pattern 21d is not shown in FIG. 7A to simplify the drawing.

Further, in the substrate 21, a plurality of through holes 21e are provided in the extending portion 21c. As shown in FIG. 7B, the through holes 21e are filled with a conductive material 22 including, for example, gold or copper. The upper portion and the lower portion of this conductive material 22 are configured to connect electrically the wiring pattern 21d and a wiring pattern 71a provided on a mounting board 71 of the set product. Note that the wiring pattern 71a is not shown in FIG. 7A to simplify the drawing.

With the above-described configuration, in the semiconductor device 1 of this embodiment, at least one of the semiconductor chips 11 to 13 connected by the substrate 21 can be electrically connected to the semiconductor chip 14 mounted on the substrate 21. As a result, with the semiconductor device 1 of this embodiment, an electric equipment system that requires a large number of semiconductor chips can be obtained easily.

Figure 8:
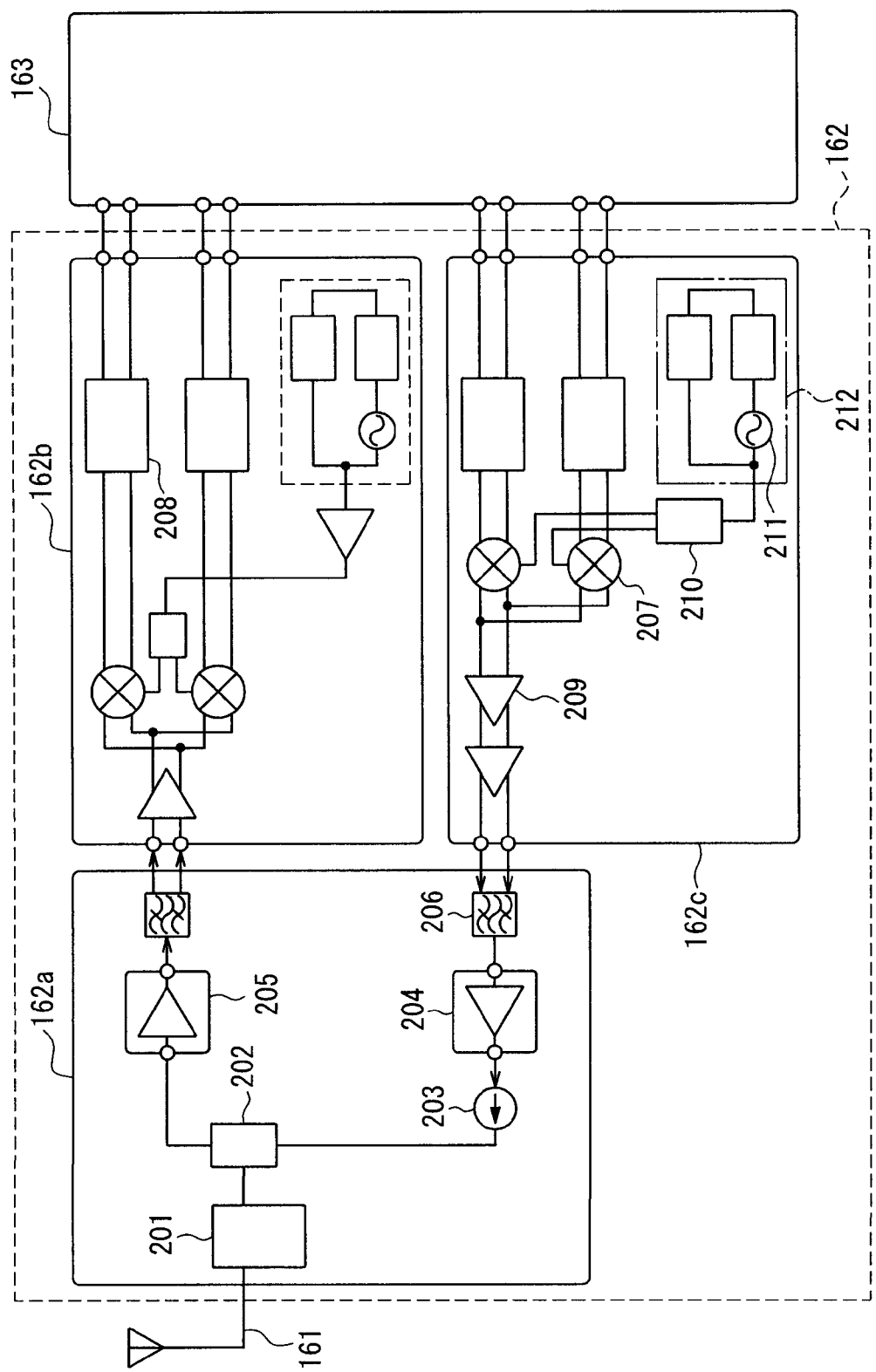
FIG. 8 is a plan view showing an example of the configuration of a relevant part of a cell phone system using the semiconductor device shown in FIGS. 7A and 7B.
Figure 9A:
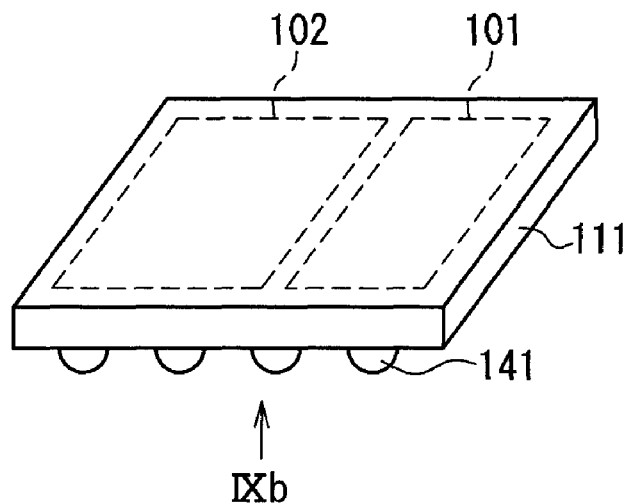
FIG. 9A is a perspective view of a conventional semiconductor device.
Figure 9B:
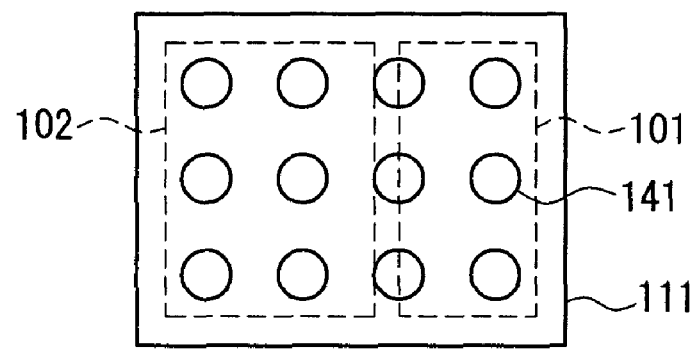
FIG. 9B is a plan view of the conventional semiconductor device of FIG. 9A as viewed in the direction of the arrow IXb.
Figure 9C:
FIG. 9C is a side view of the conventional semiconductor device.

Referring now to FIG. 8, a cell phone system using the semiconductor device 1 of this embodiment will be described in detail.

FIG. 8 is a plan view showing an example of the configuration of a relevant part of a cell phone system using the semiconductor device shown in FIGS. 7A and 7B.

As shown in FIG. 8, a cell phone system according to this embodiment includes an antenna 161, a transmission/reception unit 162 configured using the semiconductor device 1 of this embodiment, and a base band signal processing unit 163. The transmission/reception unit 162 forms an RF signal processing unit for processing radio (radio frequency) signals that are transmitted and received by the antenna 161, and includes a shared unit 162a connected to the antenna 161, and a reception unit 162b and a transmission unit 162c that are provided parallel to the shared unit 162a.

The shared unit 162a includes electric components or electric circuits that can be used commonly for the receiving operation of the reception unit 162b and the transmitting operation of the transmission unit 162c. Namely, the shared unit 162a can be formed by, for example, the semiconductor chip 11 (FIGS. 7A and 7B). Specifically, the shared unit 162a includes a switch 201, a duplexer 202, an isolator 203, a PA (Power Amplifier) 204, a LNA (Low Noise Amplifier) 205, a SAW (Surface Acoustic Wave) filter 206, and the like, which are integrated within the semiconductor chip 11.

The reception unit 162b includes electric components or electric circuits for processing reception signals input through the antenna 161 and the shared unit 162a. Namely, the reception unit 162b can be formed by, for example, the semiconductor chip 12 (FIGS. 7A and 7B). Specifically, the reception unit 162b includes a filter circuit 208, which is integrated within the semiconductor chip 12.

The transmission unit 162c includes electric components or electric circuits for processing transmission signals output through the antenna 161 and the shared unit 162a. Namely, the transmission unit 162c can be formed by, for example, the semiconductor chip 13 (FIGS. 7A and 7B). Specifically, the transmission unit 162c includes a mixer circuit 207, an amplifier circuit 209, a frequency divider 210, a VCO (Voltage Controlled Oscillator) 211 and a PLL (Phase Locked Loop) 212, which are integrated within the semiconductor chip 13.

The base band signal processing unit 163 includes electric components or electric circuits for converting the reception signals from the reception unit 162b to audio signals or packet data, and electric components or electric circuits for converting audio signals or packet data to transmission signals and outputting the transmission signals to the transmission unit 162c. Namely, the base band signal processing unit 163 can be formed by, for example, the semiconductor chip 14 (FIGS. 7A and 7B). Specifically, to the base band signal processing unit 163, a speaker or an electric-mechanical-acoustic converter or the like (not shown) that produces sounds and vibrations is connected, so as to output audio signals to the user or allow the user to sense the vibrations. A sound collecting component such as a microphone (not shown) also is connected to the base band signal processing unit 163, so that the audio signals from the sound collecting component can be input.

With the above-described configuration, the semiconductor device 1 of this embodiment can produce operational effects similar to those of Embodiment 1. In the semiconductor device 1 of this embodiment, because the wiring pattern 21d is provided on the upper surface of the substrate 21 to allow the upper surface to serve as the mounting surface, by using the substrate 21 also as the mounting board, it is possible to obtain easily the semiconductor device 1 in which a large number of semiconductor chips can be mounted. As a result, in the semiconductor device 1 of this embodiment, the substantial mounting area of the external mounting board can be reduced.

Further, in the semiconductor device 1 of this embodiment, because the through holes 21e are formed in the extending portion 21c of the substrate 21, and the wiring pattern 21d and the wiring pattern 71a of the external mounting board 71 are connected electrically by the conductive material 22 filled in the through holes 21e, it is possible to obtain the semiconductor device 1 in which a plurality of semiconductor chips can be mounted easily onto the mounting board 71.

In the cell phone system of this embodiment, because the transmission/reception unit 162 is formed with the semiconductor device 1 that can be mounted easily while preventing the increase of the mounting area, it is possible to easily reduce the size and to easily obtain a high performance cell phone system that can be produced easily. Further, because the semiconductor device 1 has excellent isolation characteristics and excellent electrical characteristics, in the transmission and reception operations, high isolation characteristics between the transmission operation and the reception operation can be realized, and a cell phone system having excellent high-frequency characteristics can be obtained easily.

The above description discusses a configuration in which the semiconductor chip 14 that is different from the semiconductor device 1 is mounted on the opposite surface (mounting surface) of the substrate 21, but the present invention is not limited thereto, and it is also possible to employ a configuration in which two or more of any of the semiconductor devices 1 of the Embodiment 1~5 are stacked.

In addition to the foregoing, it is also possible to connect the semiconductor chips 11 to 13 and the semiconductor chip 14 that forms the base band signal processing unit 163 by the substrate 21 into one piece so as to form the entire configuration of a relevant part of a cell phone system using the semiconductor device 1 of this embodiment.

The above description discusses a configuration in which the conductive material 22 is filled into the through holes 21e, but, in this embodiment, any other configuration can be used as long as the through holes for electrically connecting the wiring pattern formed on the opposite surface and the wiring pattern provided on the mounting board for mounting the plurality of semiconductor chips to each other are provided, and it is also possible to use, instead of the conductive material 22, a wiring material that can be disposed in the through holes 21e.

It is to be understood that the embodiments given above are only illustrative and are not intended to be restrictive. The technical scope of the present invention is defined by the appended claims, and the configuration described in the claims and any modification and change within the equivalent scope also fall within the technical scope of the present invention.

For example, the above description discusses a configuration in which, the plurality of semiconductor chips are connected by providing the substrate on the opposite surface in each of the plurality of semiconductor chips that is opposite to the connection surface on which the solder balls are formed by interposing the adhesive material between the substrate and the opposite surface, but there is no limitation in the present invention as long as the substrate is bonded to a surface in each of the plurality of semiconductor chips other than the connection surface by interposing an adhesive material between the substrate and the surface so as to connect the plurality of semiconductor chips to each other. It is also possible to combine the plurality of semiconductor chips with the substrate into one piece by, for example, placing the adhesive material to each side face in the plurality of semiconductor chips, or by placing an adhesive material between a side face of a semiconductor chip and the opposite surface of the other semiconductor chip.

However, as described in the above embodiment, it is preferable to connect the plurality of semiconductor chips into one piece by allowing the opposite surface in each of the plurality of semiconductor chips to bond to the substrate with an adhesive material because sufficient bonding area can be ensured easily between the substrate and each semiconductor chip, and the mechanical strength of the semiconductor device can be improved easily. Further, because a flat plate substrate can be used, there is no need to complicate the shape of the substrate.

The above description discusses a configuration in which solder balls are used as external connection terminals, but the external connection terminal of the present invention are not limited thereto, and it is also possible to use, for example, projecting electrodes such as bumps as the external connection terminal.

In Embodiment 5 given above, a configuration is described in which a cell phone system is obtained using the semiconductor device of the present invention, but there is no limitation in the electric equipment system of the present invention as long as, in an electric equipment system including a transmission unit that transmits information and a reception unit that receives information, at least one of the transmission unit and the reception unit is configured with the semiconductor device of the present invention. Specifically, the present invention is applicable to, for example, an electric equipment system that forms a wireless unit of ETC (Electronic Toll Collection) equipped vehicles, and various electric equipment (communication equipment) systems used in portable terminals for mobile communication systems such as pagers.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device comprising:
  a plurality of semiconductor chips each having a chip size package structure and a connection surface provided with an external connection terminal for external connection; and
  a substrate for connecting the plurality of semiconductor chips to each other so as to be bonded via an adhesive material to a surface other than the connection surface in each of the plurality of semiconductor chips, wherein the substrate is formed to have a polygonal shape including an L shape and a T shape.

2. A semiconductor device comprising:

a plurality of semiconductor chips each having a chip size package structure and a connection surface provided with an external connection terminal for external connection; and a substrate for connecting the plurality of semiconductor chips to each other so as to be bonded via an adhesive material to a surface other than the connection surface in each of the plurality of semiconductor chips, wherein the substrate is provided with a shield portion disposed between and in contact with two of the semiconductor chips to prevent the two semiconductor chips from being brought into direct contact with each other.

3. The semiconductor device according to claim 2, wherein the shield portion is formed by deforming a part of the substrate.

4. A semiconductor device comprising:

a plurality of semiconductor chips each having a chip size package structure and a connection surface provided with an external connection terminal for external connection; and a substrate for connecting the plurality of semiconductor chips to each other so as to be bonded via an adhesive material to a surface other than the connection surface in each of the plurality of semiconductor chips, wherein as the adhesive material, a conductive adhesive material and an insulating adhesive material are used.

5. A semiconductor device comprising:

a plurality of semiconductor chips each having a chip size package structure and a connection surface provided with an external connection terminal for external connection; and a substrate for connecting the plurality of semiconductor chips to each other so as to be bonded via an adhesive material to a surface other than the connection surface in each of the plurality of semiconductor chips, wherein at least one of the substrate and the adhesive material is connected to a power source or a ground to have the same potential as that of the power source or the ground.

6. A semiconductor device comprising:

a plurality of semiconductor chips each having a chip size package structure and a connection surface provided with an external connection terminal for external connection; and a substrate for connecting the plurality for semiconductor chips to each other so as to be bonded via an adhesive material to a surface other than the connection surface in each of the plurality of semiconductor chips, wherein, in the substrate, a wiring pattern is formed on an opposite surface that is opposite to a connect surface on which the plurality of semiconductor chips are connected, and the opposite surface serves as a mounting surface.

7. The semiconductor device according to claim 6, wherein a through hole is formed in the substrate to connect electrically the wiring pattern formed on the opposite surface and the wiring pattern provided on the mounting board for mounting the plurality of semiconductor chips.

8. An electric equipment system comprising a transmission unit that transmits information and a reception unit that receives information, wherein at least one of the transmission unit and the reception unit is configured with the semiconductor device comprising: a plurality of semiconductor chips each having a chip size package structure and a connection surface provided with an external connection terminal for external connection; and a substrate for connecting the plurality of semiconductor chips to each other so as to be bonded via an adhesive material to a surface other than the connection surface in each of the plurality of semiconductor chips.

\* \* \* \* \*